United States Patent [19]

Inaba et al.

[11] Patent Number: 4,649,507
[45] Date of Patent: Mar. 10, 1987

[54] SEGMENTED TRANSVERSAL FILTER

[75] Inventors: Masao Inaba; Hiroshi Takahashi, both of Tokyo; Kazuhiko Nosaka; Takahiko Hattori, both of Osaka, all of Japan

[73] Assignees: NEC Corporation, Tokyo; New Nippon Electric Co., Ltd., Osaka, both of Japan

[21] Appl. No.: 531,400

[22] Filed: Sep. 12, 1983

[30] Foreign Application Priority Data

Sep. 20, 1982 [JP] Japan ............................. 57-163726

[51] Int. Cl.[4] ..................... G06F 15/31; H03H 15/00
[52] U.S. Cl. .................................................. 364/724
[58] Field of Search ................. 364/724, 825; 333/166

[56] References Cited

U.S. PATENT DOCUMENTS 4,377,793  3/1983  Horna .............................. 333/166
4,475,211  10/1984 Mattis, Jr. et al. ................. 364/724
4,524,424  6/1985  White .............................. 364/724

Primary Examiner—David H. Malzahn
Attorney, Agent, or Firm—Gerald J. Ferguson, Jr.; Michael P. Hoffman; Ronni S. Malamud

[57] ABSTRACT

A segmented digital transversal filter comprising a first transversal filter 4 that eliminates all frequency components from a signal sequence above half the subsampling frequency, a second transversal filter 11 that convolutes the output of the first filter with a decimated and energy compensated lower band of filter coefficients ($HI_1'$), a third transversal filter 22 that convolutes the output of the first filter and a decimated and energy-compensated upper band of filter coefficients ($HI_2'$), and a fourth transversal filter 32 that convolutes the original signal sequence and the central band of filter coefficients ($HI_3$). Delays 21 and 31 are added so that the outputs of the second, third and fourth filters arrive concurrently at an adder 51, the sum being the output of the invention.

4 Claims, 4 Drawing Figures

SEGMENTED TRANSVERSAL FILTER

BACKGROUND OF THE INVENTION

The present invention relates generally to a transversal filter and particularly to a transversal filter used for processing of a digital audio signal.

The processing of a digital audio signal modulated by a pulse-code modulation system, hereinafter referred to simply as a PCM system, is usually accomplished by controlling the frequency characteristic of the PCM signal which is sampled at a constant sampling frequency. To achieve such control, an infinite impulse response (hereinafter referred to as "IIR") digital filter and a finite impulse response (hereinafter referred to as "FIR") digital filter are generally used. The IIR digital filter has the advantage that design formule in closed form can be used to design an IIR filter in which variable frequencies can be selected. However, such a design neglects the phase characteristic of the filter. Therefore, it is difficult for an IIR digital filter to obtain both a desired amplitude characteristic and a desired phase frequency characteristic.

On the other hand, if a transversal filter utilizing a set of FIR filters is to be designed with desired frequency characteristic over a frequency bandwidth extending from low frequency to a frequency near $f_s/2$, where $f_s$ is a sampling frequency, an unacceptably high order of filter design is required. As a result, the transversal filter has the disadvantage of being too complex in comparison with the IIR digital filter. To eliminate this disadvantage, it has been proposed to divide the frequency band into some frequency bands below $f_s/2$. The transversal filters are then used for the frequency bands. A predetermined frequency characteristic is then obtained by synthesizing the filtering frequency characteristics of the respective filters, thereby reducing the complexity of the apparatus. However, it becomes difficult to design the crossover frequency characteristic in each frequency band because in the low frequency band, in addition to the sampling at the sampling frequency $f_s$, a subsampling is also effected at a subsampling frequency $f_s'$, which is lower than the sampling frequency $f_s$. Further, it is also difficult to design the filter's order if a filter having an arbitrary frequency characteristic is to be obtained.

SUMMARY OF THE INVENTION

Accordingly, an object of the present invention is to provide a transversal filter having a filter coefficient sequence divided into a plurality of transversal filter sections, for example three filter sections, thereby reducing the size of the filter coefficient sequence covered by a single transversal filter section. In the first and second sections of the three transversal filter sections, a convolutional operation is performed upon a decimated filter coefficient sequence and the input signal row corresponding to the decimated filter coefficient sequence. Furthermore, a compensation is made for the energy of the filter coefficients which are dropped out by such decimation of the filter coefficient sequence. As a result, the number of operations can be reduced by a factor corresponding to the number of the filter coefficients that are decimated from the sequence. Using this invention a predetermined frequency characteristic of the amplitude and phases can be obtained, the complexity of the filter is reduced, and the design of the cross-over frequency characteristic and the filter coefficients is facilitated.

DETAILED DESCRIPTION OF THE PREFERRED EMBODIMENTS

Figure 1:
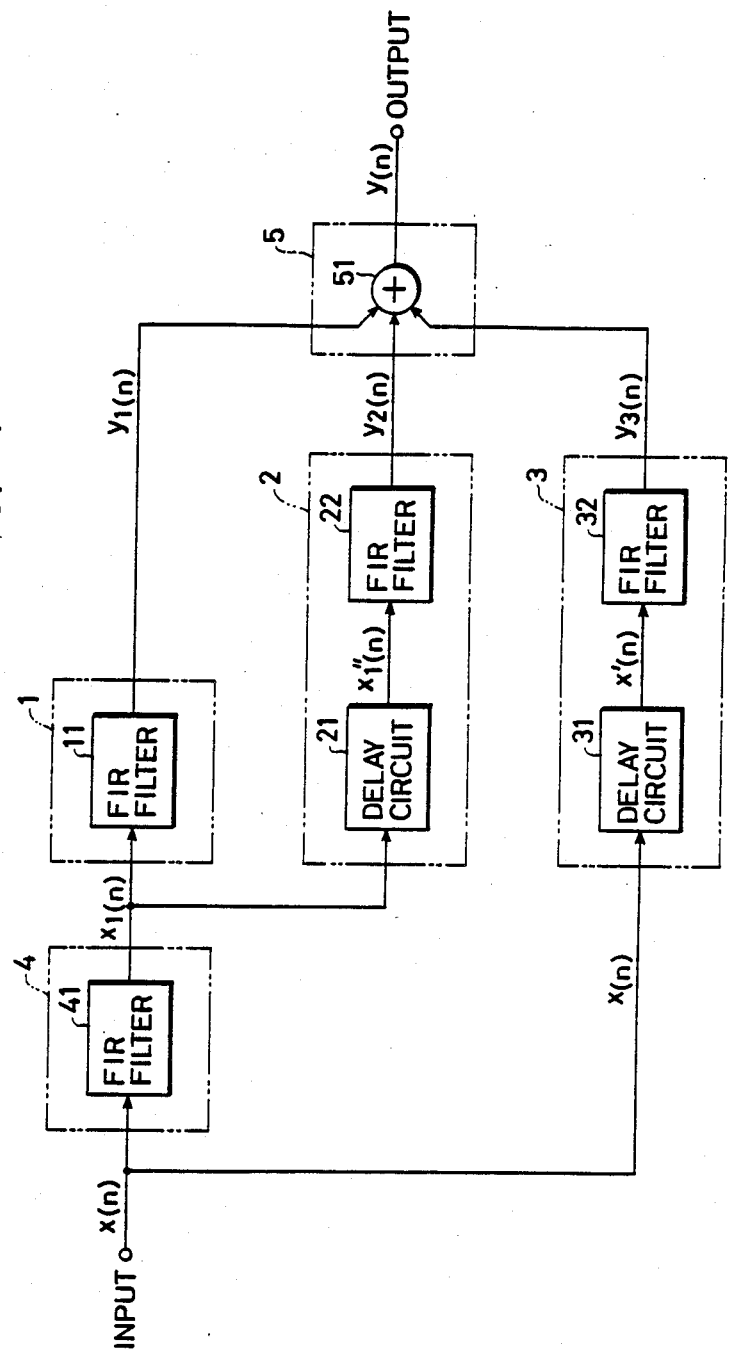
FIG. 1 is a block diagram showing a first embodiment of a transversal filter of the present invention.

Referring now to the drawings, embodiments of the present invention will be explained in detail. FIG. 1 is a block diagram showing a first embodiment of the transversal filter of the present invention.

FIG. 1 shows the five principle elements of this embodiment: a first transversal filter section 1, a second transversal filter section 2, a third transversal filter section 3, a fourth transversal filter section 4, and an adder system 5. The fourth filter receives a sequence x(n) of an input signal and eliminates all frequency components above $f_s'/2$ from the sequence x(n) to output the sequence $x_1(n)$. The third transversal filter section 3 receives the input signal sequence x(n). If D is the number of coefficients decimated or eliminated from filter coefficient sequence, then $f_s'/2$ is equal to $f_s/2(D+1)$.

Figure 2A:
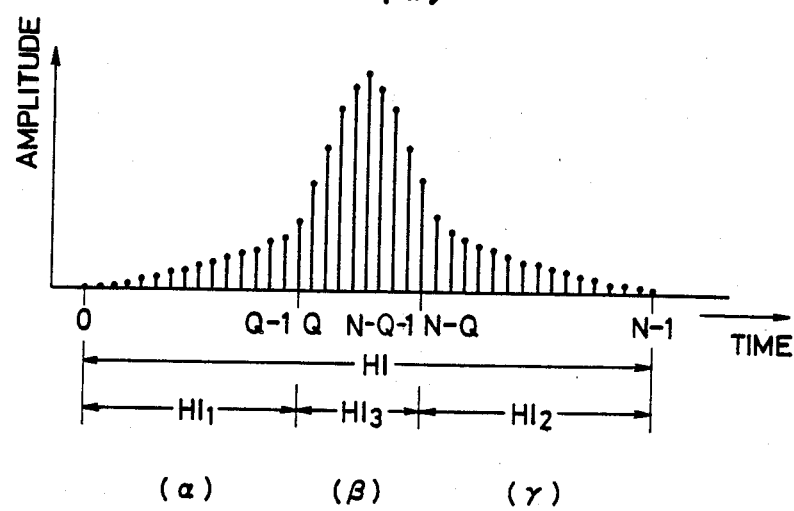
FIG. 2(a) is a graph showing a transversal filter coefficient row HI.
Figure 2B:
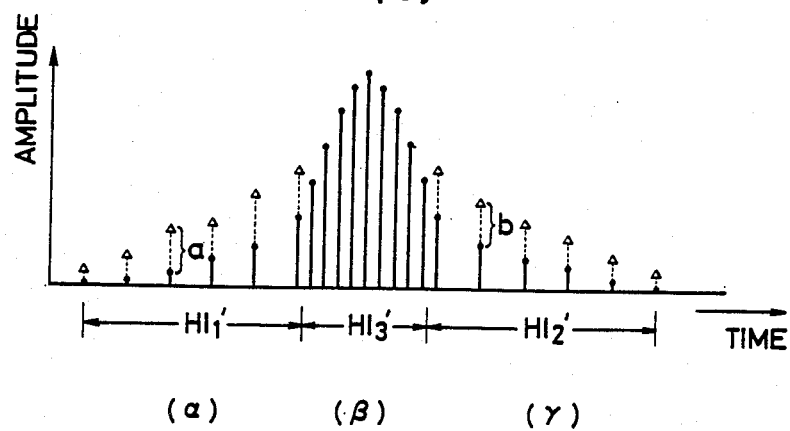
FIG. 2(b) is a graph showing how the end transversal filter coefficient sequences $HI_1'$ and $HI_2'$, are obtained by dividing the sequence HI of FIG. 2(a), decimating the end sequences $HI_1$ and $HI_2$ and compensating the energy of the decimated elements of $HI_1$ and $HI_2$.

In FIG. 2(a) is shown the amplitude distribution as plotted as a function of time for the elements of the filter coefficient sequence HI, which is the sequence before it has been decimated. These elements are also labelled by integers 0 to $N-1$, where N is the length of the undecimated sequence HI. FIG. 2(b) shows, in parallel to FIG. 2(a), the amplitude distribution for the decimated filter coefficient sequence to be described.

In FIG. 2(a) is shown the undecimated filter coefficient sequence having N elements, while FIG. 2(b) shows the decimated filter coefficient sequence that has n elements, but the numbering of the undecimated sequence is maintained as in the decimated sequence. The decimated filter coefficient sequence $HI_1'$ corresponding to the first transversal filter 1 has q elements and has elements numbered between 0 and $Q-1$. Both n and q are arbitrary integers. However, N must be larger than Q. The third transversal filter portion has a filter coefficient sequence $HI_3$ from Q to $(N-Q-1)$ as shown in ($\beta$) of FIGS. 2(a) and 2(b). As shown in ($\alpha$) of FIG. 2(b), the decimated filter coefficient sequence $HI_1'$ is adjusted to compensate the energy of the decimated filter coefficient sequence such that the energy of the coefficients, decimated or eliminated from the sequence $HI_1$ of FIG. 2(a) is added to the remaining coefficients in the sequence $HI_1'$ of FIG. 2(b).

Referring now to FIG. 1, the second transversal filter section 2 corresponds to the filter coefficient sequence $HI_2$ having elements from $(N-Q)$ to $(N-1)$ as shown in (Y) of FIG. 2(a). Similarly to the filter coefficient sequence $HI_1'$, mentioned above, the filter coefficient sequence $HI_2'$ is adjusted so as to compensate the energy of the decimated filter coefficient sequence $HI_2'$ such that the energy of the coefficients decimated from the filter coefficient sequence $HI_1$ of FIG. 2(a) is added to the elements of the remaining filter coefficients in the sequence $HI_2'$ of (Y) of FIG. 2(b).

The adder system receives the output signal $y_1(n)$ from the first filter section 1, the output signal sequence $y_2(n)$ from the second filter section 2, and the output signal sequence $y_3(n)$ from the third filter section 3, adds the elements thereof and outputs a signal sequence $y(n)$. Thus there results a transversal filter comprising three transversal filters, each of which is characterized by its own coefficient sequences.

In the above embodiment, the number of elements in the first filter coefficient sequence $HI_1$ is equal to that of the elements in the second filter coefficient sequence $HI_2$, but the invention is not limited to embodiments employing this equality. However, if the number of elements is not equal in both side sequences $HI_1$ and $HI_2$, it will be more difficult to match filtering characteristic than in the case where the number of elements in $HI_1$ and $HI_2$ is equal.

In the embodiment of FIG. 1, the unchanged input signal row $x(n)$ which is sampled at the sampling frequency $f_s$, is applied to the third and fourth transversal filter sections 3 and 4. The third filter section 3 comprises a delay circuit 31 for receiving the input signal sequence $x(n)$ and a transversal filter 32 connected to the delay circuit 31. The input signal row $x(n)$ is delayed by the delay circuit 31 for the time required so that the time for the operation upon $x(n)$ in the fourth and first filter sections 4 and 1 equals the time for the operation of filter section 3. The delay circuit 31 produces a delayed signal sequence $x'(n)$ that is input to the filter 32. The filter coefficient sequence $HI_3$ is implemented in the transversal filter 32 so that it outputs a signal sequence $y_3(n)$ having the elements from $(n-Q)$ to $(n-N+Q+1)$. The output signal sequence $y_3(n)$ is obtained in the transversal filter 32 by the convolutional operation of the third filter coefficient sequence $HI_3$ upon the delayed signal sequence $x'(n)$. Thereafter the signal sequence $y_3(n)$ from the third filter section 3 is applied to the adder system 5.

The order of the filter 32 in the third filter section 3 is $(N-2Q)$, while the fourth filter section 4 has a transversal filter 41 of order L for operating upon the input signal sequence $x(n)$. In order to avoid reflection noise, a fourth filter coefficient sequence $HI_4$ of the transversal filter 41 is implemented so as to eliminate the frequency components above $f_s/2(D+1)$, where D is a positive integer and equal to the number of the filter coefficients that are decimated. The filter 41 receives the input signal sequence $x(n)$ and performs a convolutional operation of the input signal sequence $x(n)$ with the fourth filter coefficient sequence $HI_4$ at an $1/f_s$ period in order to eliminate the frequency components above $f_s/2(D+1)$. Specifically, the filter 41 generates the signal sequence $x_1(n)$ from the input signal sequence $x(n)$ by removing the frequency components above $f_s/2(D+1)$. Then the signal sequence $x_1(n)$ is applied to the first and second filter sections 1 and 2.

The first filter section 1 has a transversal filter 11 of order P, which generates the signal sequence $y_1(n)$ from the input sequence $x_1(n)$. The first filter coefficient sequence $HI_1'$ is implemented such that the energy of the elements of the signal sequence eliminated by decimating the signal sequence $x_1(n)$ at an arbitrary period is added in compensation to the remaining elements of the signal sequence as shown by a in ($\alpha$) of FIG. 2(b). Thereby the transversal filter 11 performs the convolutional operation of the first filter coefficient sequence $HI_1'$ with the signal sequence $x_1(n)$ corresponding to the decimating period $(D+1)/f_s$ and generates the output $y_1(n)$. Thereafter, the output signal sequence $y_1(n)$ from the filter section 1 is applied to the adder system 5.

The second transversal filter section 2 comprises a delay circuit 21 and a transversal filter 22 of order P. The signal sequence $x_1(n)$ is received by the delay circuit 21 and is delayed therein such that the output signal $y_2(n)$ from the second filter section 2 is generated at the same time as the output signal $y_1(n)$ from the first filter section 1. A signal sequence $x_1''(n)$ outputted from the delay circuit 21 is applied to the transversal filter 22. In the above embodiment the delay circuit 21 is positioned before the filter 22, but it is possible to locate the delay circuit 21 after the filter 22. The filter 22 is designed such that it generates the signal sequence $y_2(n)$ from the elements $(n-N-Q)$ to $(n-N+1)$ of the input signal sequence $x(n)$. Additionally, the second filter coefficient sequence $HI_2'$ is implemented such that the energy of the signal sequence decimated from the signal sequence $x_1(n)$ at an arbitrary decimating period is added into the remaining elements of the signal sequence for the purpose of compensation, as shown in ($\gamma$) of FIG. 2(b). The filter 22 receiving the signal sequence $x_1''(n)$ performs a convolutional operation of the second filter coefficient sequence $HI_2'$ with the delayed signal sequence $x_1''(n)$ corresponding to the decimating period $(D+1)/f_s$, and thereby generates the output $y_2(n)$. Thereafter, the signal row $y_2(n)$ is applied to the adder system 5. Upon receiving the signal sequences $y_1(n)$, $y_2(n)$ and $y_3(n)$, an adder 51 of the adder system 5 outputs an output signal sequence $y(n)$.

Figure 3:
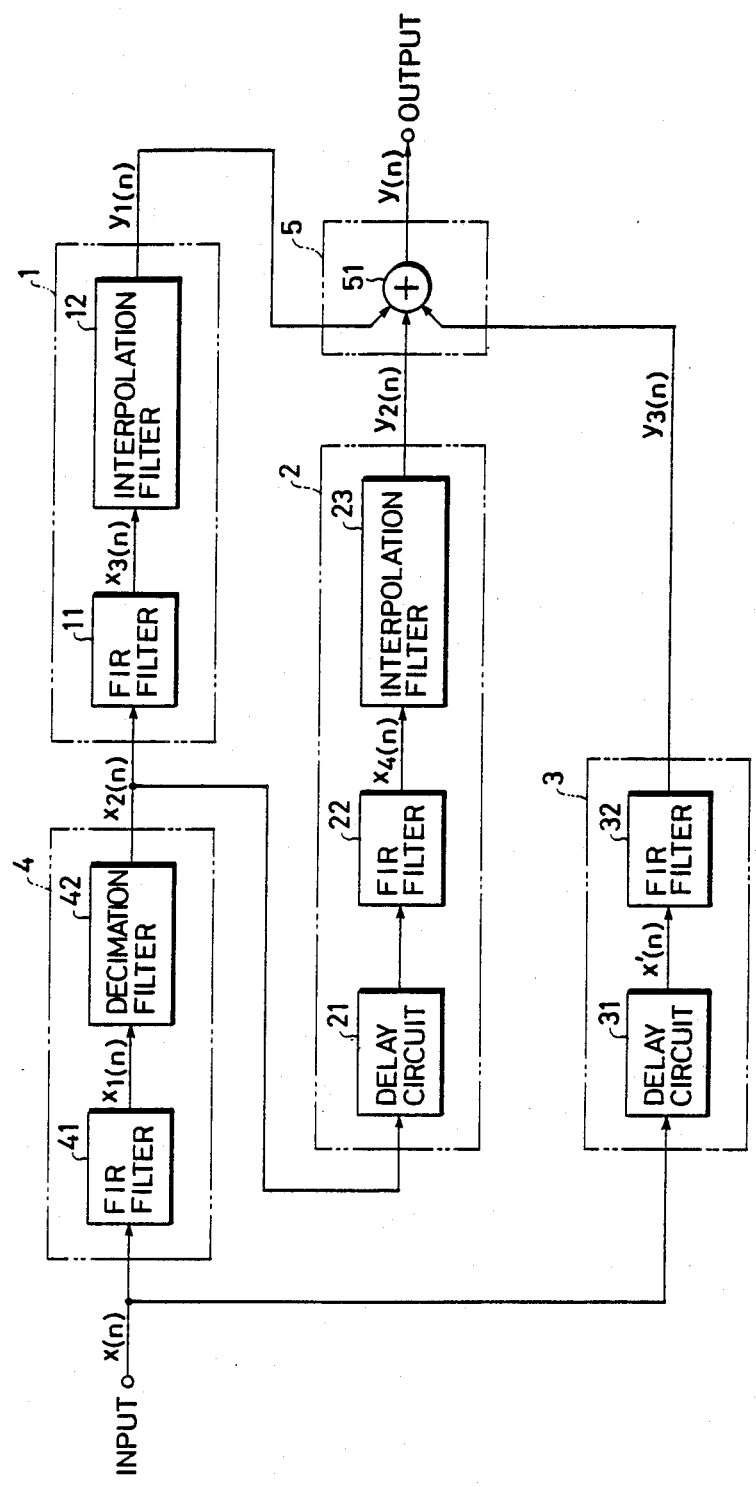
FIG. 3 is a block diagram showing a second embodiment of the present invention.

Referring now to FIG. 3, a second embodiment of the present invention is shown in block diagram form. In FIG. 3, the same numerals and designations indicate the same parts or equivalent parts thereto as those of FIG. 1.

In the second embodiment, the convolutional operations performed in the transversal filters 11 and 22 are done at a period $(D+1)/f_s$ thereby reducing the number of operations in each unit period. A decimation filter 42 is disposed in front of the filters 11 and 12.

The fourth transversal filter portion 4 comprises the transversal filter 41 and the decimation filter 42. The decimation filter 42 decimates the signal sequence $x_1(n)$ coming from the filter 41 at an arbitrary but constant period and outputs the decimated signal sequence $x_2(n)$. Thereafter, the decimated signal sequence $x_2(n)$ is applied to the first and second filter sectios 1 and 2. The transversal filters 11 and 12 are designed such that the filter coefficient sequences $HI_1'$ and $HI_2'$ of the filters 11 and 12 generate decimated signal sequences $x_3(n)$ and $x_4(n)$, as shown in ($\alpha$) and (Y) of FIG. 2(b). There are additionally provided interpolation filters 12 and 23 after the filters 11 and 22, respectively. The transversal filter section 1 comprises the transversal filter 11 and the interpolation filter 12. The second transversal filter section 2 comprises the delay circuit 21, the transversal filter 22, and the interpolation filter 23. A sixth filter coefficient sequence $HI_6$ is implemented such that the interpolation filter 12 generates the signal sequence $y_1(n)$ sampled at the sampling rate $f_s$ from the signal sequence $x_3(n)$ having a period $(D+1)/f_s$. Similarly, a seventh filter coefficient sequence $HI_7$ is implemented such that the interpolation filter 23 generates the signal sequence $y_2(n)$ sampled at the sampling period $1/f_s$ from the signal sequence $x_3(n)$ having a period $(D+1)/f_s$.

The adder 51 adds the signal sequences $y_1(n)$, $y_2(n)$ and $y_3(n)$ to generate the output signal sequence $y(n)$.

As mentioned above, according to the transversal filter of the present invention, the filter coefficient sequence of the fourth transversal filter section 4, or of the first and second transversal filter sections 1 and 2 is decimated, thereby reducing the number of filter coefficients. Therefore the number of operations is advantageously reduced and the roundoff error is also reduced. Accordingly, the present invention has the advantage that operational precision is increased and the complexity of the circuit is reduced. Furthermore, an arbitrary filtering frequency characteristic may be realized by controlling the filter coefficients of the transversal filter sections, so that the present invention can be applied to a technology such as signal processing in pulsecode modulation communication.

Furthermore, by the inclusion of interpolation filters 12 and 23 in the first and second filter sections 1 and 2, the filters 11 and 22 can execute the convolutional operation at a period $(D+1)/f_s$ thereby reducing the number of operations per unit time. As a result, the circuit complexity of the filters 11 and 12 may be further reduced providing overall circuit simplicity of the entire transversal filter.

In the above embodiments, the filter coefficient sequence HI is divided into three segments, but the present invention is not limited to the triple segmentation, but the filter coefficient sequence HI of the present invention may be divided into any plurality of filter coefficient sequence segments.

What is claimed is:

1. A segmented transversal filter, comprising:
   a lowpass filter for filtering a signal;
   a first transversal filter connected to the output of said lowpass filter, said first filter having coefficients decimated at a predetermined frequency period from one end segment of a transversal filter coefficient sequence, said coefficients being adjusted to compensate the energy of the decimated coefficients;
   a second transversal filter connected to the output of said lowpass filter, said second filter having coefficients decimated at said period from the other end segment of said sequence, said coefficients being adjusted to compensate for the energy of the decimated coefficients;
   a third transversal filter receiving said signal, said third transversal filter having coefficients from a central segment of said sequence;
   means for synchronizing the outputs of said first, second, and third filters; and
   an adder for adding the synchronized outputs of said first, second and third filters.

2. A segmented transversal filter, as recited in claim 1, where said synchronizing means includes delaying means for establishing said synchronism at the adder, said delaying means including a first delay means in series circuit with said second transversal filter and a second delay means in series circuit with said third transversal filter.

3. A segmented transversal filter, comprising:
   a lowpass filter for filtering a signal;
   a decimation filter for decimating the output signal sequence of said lowpass filter;
   a first transversal filter connected to the output of said decimation filter, said first filter having coefficients decimated at a predetermined frequency period from one end segment of a transversal filter coefficient sequence, said coefficients being adjusted to compensate for the energy of the decimated coefficients;
   a second transversal filter connected to the output of said decimation filter, said second filter having coefficients decimated at said period from the other end segment of said sequence, said coefficients being adjusted to compensate for the energy of the decimated coefficients;
   a third transversal filter receiving said signal, said third transversal filter having coefficients from a central segment of said sequence;
   first and second interpolation filters responsive to the outputs of said first and second filters;
   means for synchronizing the outputs of said first and second interpolation filters and said third transversal filter; and
   an adder for adding the synchronized outputs of said first and second interpolation filters and said third transversal filter.

4. A segmented transversal filter, as recited in claim 3, where said synchronizing means includes delaying means for establishing said synchronism at the adder, said delaying means including a first delay means in series circuit with said second transversal filter and a second delay means in series circuit with said third transversal filter.

* * * * *